United States Patent
Brown et al.

(10) Patent No.: US 6,653,215 B1
(45) Date of Patent: Nov. 25, 2003

(54) CONTACT TO N-GAN WITH AU TERMINATION

(75) Inventors: Michael G. Brown, Valerico, FL (US); Ivan Eliashevich, South Orange, NJ (US); Keng Ouyang, Belle Mead, NJ (US); Hari Venugopalan, Somerset, NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/971,965

(22) Filed: Oct. 5, 2001

Related U.S. Application Data

(63) Continuation-in-part of application No. 09/692,953, filed on Oct. 20, 2000.
(60) Provisional application No. 60/238,221, filed on Oct. 5, 2000.

(51) Int. Cl.[7] .................... H01L 21/28; H01L 21/3205
(52) U.S. Cl. .................... 438/600; 438/604; 438/605; 438/606; 438/48
(58) Field of Search .................... 438/604–606, 438/46, 933, 752, 597; 257/613, 615, 616, 91, 99, 103, 744, 745, 600

(56) References Cited

U.S. PATENT DOCUMENTS

| | | |
|---|---|---|
| 3,751,292 A | 8/1973 | Kongable |
| 5,563,422 A | 10/1996 | Nakamura et al. |
| 6,242,761 B1 * | 6/2001 | Fujimoto et al. ............. 257/94 |
| 6,423,562 B1 * | 7/2002 | Nido et al. .................... 438/48 |

OTHER PUBLICATIONS

Lin et al., "Low Resistance Ohmic Contacts on Wide Bank Cap GaN," 64(8) Applied Physics Letters, Feb. 1994, pp. 1003–1005.

* cited by examiner

*Primary Examiner*—Carl Whitehead, Jr.
*Assistant Examiner*—Thanh Nguyen
(74) *Attorney, Agent, or Firm*—Fay, Sharpe, Fagan, Minnich & McKee, LLP

(57) ABSTRACT

A contact for n-type III–V semiconductor such as GaN and related nitride-based semiconductors is formed by depositing Al, Ti, Pt and Au in that order on the n-type semiconductor and annealing the resulting stack, desirably at about 400–600° C. for about 1–10 minutes. The resulting contact provides a low-resistance, ohmic contact to the semiconductor and excellent bonding to gold leads.

17 Claims, 2 Drawing Sheets

CONTACT TO N-GAN WITH AU TERMINATION

CROSS-REFERENCE TO RELATED APPLICATIONS

The present application claims benefit of U.S. Provisional Patent Application No. 60/238,221, filed Oct. 5, 2000, the disclosure of which is hereby incorporated by reference herein. The present application is also a continuation-in-part of U.S. patent application Ser. No. 09/692,953 Oct. 20, 200, the disclosure of which is hereby incorporated by reference herein.

BACKGROUND OF THE INVENTION

Typical semiconductor devices include regions of material having n-type conductivity, in which electrical current is carried principally by electrons, and material having p-type conductivity, in which electrical current is carried principally by electron vacancies, commonly referred to as "holes." The semiconductor device is connected to an external electical circuit by contacts. For example, a light-emitting diode includes p-type and n-type regions and a junction between these regions. A contact referred to as the p-contact is provided on the p-type region, whereas a contact referred to as the n-contact is provided on the n-type region. When an electrical voltage in the proper direction is applied between these contacts by an external power source, a current flows between the contact. Electrons in the n-type region and holes in the p-type region move toward the junction and combine with one another at or adjacent to the junction to produce light.

In most semiconductor devices, the contacts should exhibit "ohmic" characteristics. That is, the electrical voltage loss at the boundary between the contact and the semiconductor material should be substantially proportional to the current, and should be independent of the direction of current flow, so that the contact acts as a conventional electrical resistor. Also, the contact desirably has low-resistance. For example, a light emitting diode with low-resistance ohmic contacts can convert electrical power into light more efficiently than a similar diode with high-resistance contacts. The contacts typically are connected to metallic leads as, for example, by wire-bonding processes. The contacts should include metals which are compatable with these processes.

The materials which provide low-resistance ohmic contacts vary with the composition and conductivity type of the semiconductor in the device. Certain semiconductor devices are formed from III–V materials, i.e., compounds of formed from a material in Group III of the periodic table and a material in Group V of the periodic table as, for example, gallium nitride (GaN) and similar materials. Contacts for p-type GaN commonly include gold or combinations of gold and nickel. For example, contacts for use on light-emitting diodes commonly include an electrode formed from thin layers of gold and nickel abutting the p-type GaN and a thick pad region including a layer of gold at the top surface of the pad. When the electrode is annealed it becomes transparent so that light emitted within the LED can pass out of the device through the electrode. The gold-containing pad provides a surface suitable for wire bonding using gold wires. The pad covers only a small portion of the device surface.

Lin et al., *Low Resistance Ohmic Contacts On Wide Band Gap GaN*, 64 (8) Applied Physics Letters February 1994, at 1003–1005, and U.S. Pat. No. 5,563,422 disclose contacts for n-type GaN formed from titanium, aluminum, or both, which is annealed. The '422 patent states that if titanium and aluminum are provided in a multi-layer structure, deposition of titanium should be performed first, followed by deposition of aluminum. A contact including only titanium and aluminum would be incompatable with gold wire bonding. Accordingly, the '422 patent suggests covering the Ti/Au structure with a "high-melting point metallic material" preferably including gold as a topmost layer, and preferably including another high-melting metal such as titanium and/or nickel.

Despite these and other efforts in the art, still further improvements would be desirable. For example, where a gold layer is provided on a contact containing titanium and aluminum, the gold layer can change during annealing. These changes impair the reliability of the wire bonds. It would be desirable to provide a contact and contact-forming method for n-type GaN and other n-type III–V semiconductors which would provide a low-resistance ohmic contact and which would also allow reliable bonding of gold leads such as gold wires to the contact.

SUMMARY OF THE INVENTION

One aspect of the invention provides a method of forming a contact on an n-type III–V semiconductor comprising the steps of depositing a base layer formed predominantly from Al on an n-type III–V semiconductor; then depositing a first barrier layer formed predominantly of one or more first barrier metals selected from the group consisting of Ti,Ta and Pd on the base layer; then depositing a second barrier layer formed predominantly of one or more second barrier metals selected from the group consisting of Pt, W and alloys of Ti and W on said first barrier layer. The method according to this aspect of the invention further includes the step of depositing a top layer formed predominantly of one or more top metals selected from the group consisting of Au and Ag on said second barrier layer, whereby said layers form a stack on the n-type semiconductor.

The deposited layers form a stack on the n-type semiconductor. The n-type III–V semiconductor with the stack is annealed to form the contact.

The III–V semiconductor preferably is a "nitride semiconductor," i.e. a III–V semiconductor in which N constitutes 50% or more, and preferably 80% or more of the group V element. The semiconductor more preferably is a gallium nitride based semiconductor, i.e., a nitride semiconductor including gallium as, for example, GaN, InGaN, AlGaN or AlInGaN. The annealing step typically is performed at a temperature of about 400–600° C. for about 1–10 minutes. Most preferably, the base layer consists essentially of Al, the first barrier layer consists essentially of Ti, the second barrier layer consists essentially of Pt and the top layer consists essentially of Au.

Although the present invention is not limited by any theory of operation, it is believed that the barrier layers such as Ti and Pt layers above the Al-containing base layer prevent undesirable reactions between Al and the metal of the top layer Au during annealing and/or during service. Although the present invention also is not limited by any theory of operation in this respect as well, it is believed that the Al in the base layer abutting the n-type semiconductor diffuses into the semiconductor and/or forms intermediate materials at the boundary with the n-type semiconductor. Whatever the mechanism of operation, the resulting contact has a low resistance and ohmic behavior. There may be some alloying of Ti and Al, and/or some alloying of Pt and Au.

A further aspect of the present invention provides a semiconductor unit including n-type III–V semiconductor with an n-type contact made as discussed above. The unit may further include a lead, preferably a gold-containing lead such as a gold wire or a gold-covered lead formed from another material, bonded to the contact.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
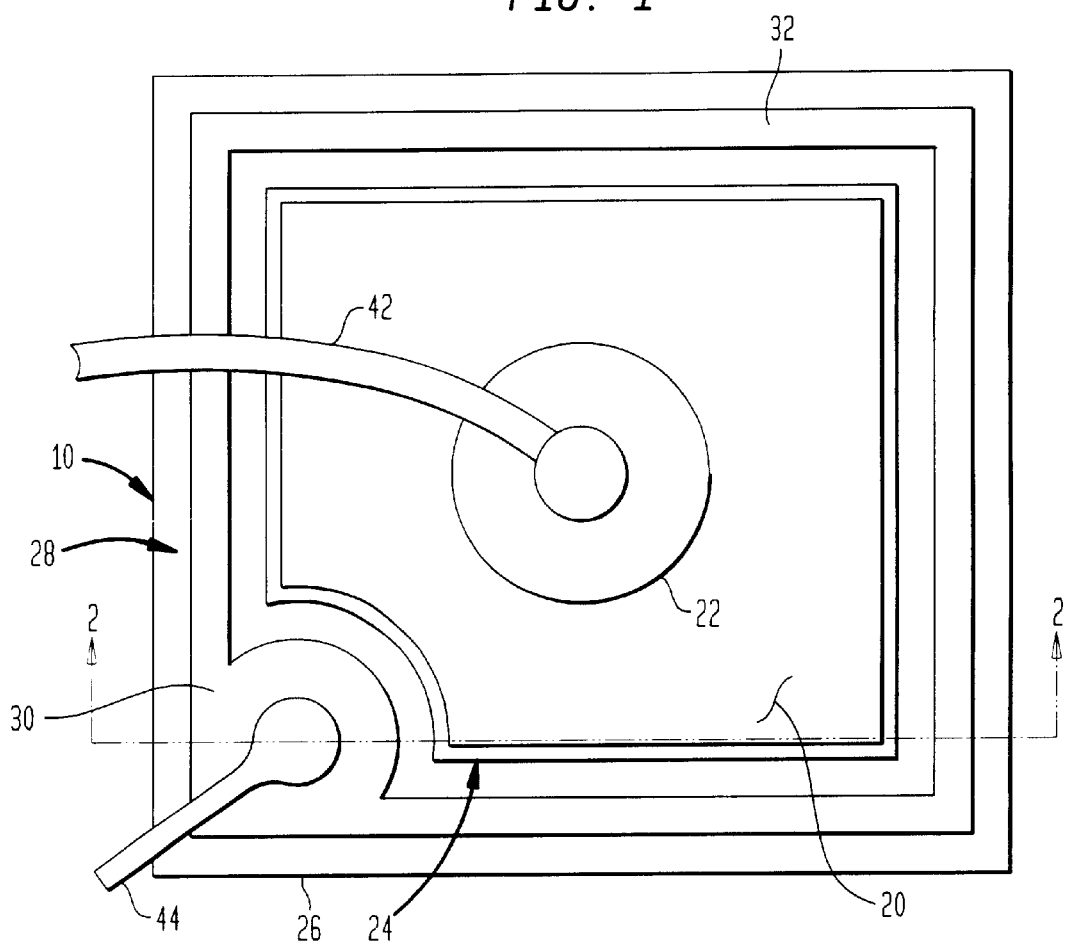
FIG. 1 is a diagrammatic top plan view of a semiconductor unit in accordance with one embodiment of the present invention.

A semiconductor unit in accordance with one embodiment of the invention is a light-emitting diode having a semiconductor body including an n-type III–V semiconductor region 10 formed on a substrate 12, a p-type semiconductor region 14 and a junction 16 between the p-type and n-type regions. A p-contact 18 includes a thin transparent electrode 20 overlying the surface of the p-type region 14 and a bonding pad 22 covering a relatively small portion of the electrode. The p-contact may be of conventional structure and may include, for example, gold and nickel in the electrode 20 and gold in the pad 22. The semiconductor body defines a mesa portion 24 projecting upwardly from a ledge 26. The ledge 26 is defined by the n-type region 10, so that the ledge surface constitutes a surface of the n-type region. As best seen in FIG. 1, ledge 26 extends around the periphery of mesa 24, and the ledge has an enlarged region at one corner of the semiconductor body. An n-contact 28 includes a relatively wide, circular pad region 30 and a thin, elongated striplike region 32 extending along the edge region and encircling the mesa portion. As described in greater detail in the aforementioned U.S. patent application Ser. No. 09/692, 953, this physical configuration of the electrodes promotes spreading of the electrical current throughout the horizontal extent of the device (in the directions parallel to the plane of the drawing in FIG. 1).

Figure 3:
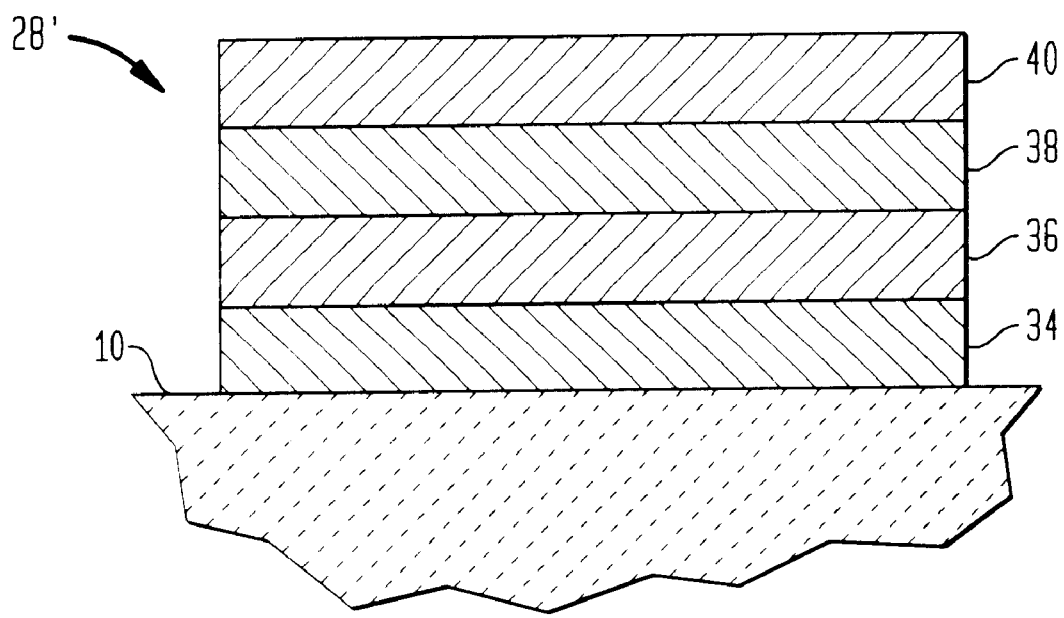
FIG. 3 is a diagrammatic sectional view of a portion of the unit illustrated in FIG. 2, during one stage of a process in accordance with one embodiment of the invention.

Contact 28 is formed by a multilayer deposition process. As seen in FIG. 3, contact 28' is in an in-process state prior to the annealing operation discussed below. The contact in this state is also referred to as a "stack" of layers. In this in-process state, the contact of this embodiment includes a base layer 34 abutting the n-type semiconductor 10, a first barrier layer 36 overlying the base layer, a second barrier layer 38 overlying the first barrier layer, and a top layer 40 overlying the second barrier layer and forming the top or exposed surface of the contact, remote from the n-type semiconductor.

The base layer desirably consists essentially of aluminium, with or without some titanium. The first barrier layer should be formed predominantly from one or metals selected from the group consisting of titanium, tantalum and palladium, and preferably consists essentially of one of these metals. Most preferably, the first barrier layer consists essentially of titanium. The second barrier layer should be formed from one or more metals selected from the group consisting of platinum, tungsten or alloys of tungsten and titanium. Preferably, the second barrier layer consists essentially of one of these metals. Most preferably, the second barrier layer consists essentially of platinum. The top layer should be formed predominantly of one or more metals selected from the group consisting of gold or silver, and preferably consists essentially of gold or silver. As used in this disclosure, the expression "formed predominantly of" a metal means that the layer includes at least about 75% of such metal. Each of these layers may include minor amounts of impurities which do not materially affect the performance of the finished contact as discussed below. The base layer in the in-process contact, before anneal may include substantial amounts of Ti, as, for example, up to about 25%. In this case, the step of depositing Al can include the step of depositing some Ti along with the Al. Preferably, each layer in the in-process contact, prior to annealing, consists essentially of a single metal as recited, and is as close to a pure, single metal layer as practicable. Layers 34–40 may be deposited by essentially any conventional deposition technique which does not contaminate the underlying semiconductor or other elements of the device incorporating the semiconductor, as, for example, sputtering, evaporation, and plating.

After deposition, layers 34–40 constituting the in-process contact or stack are annealed. Annealing is required from a low resistance contact. Although the present invention is not limited by any theory of operation, it is believed that the mechanism involves diffusion of Al through the native oxide on n-GaN, to intimate contact with the n-GaN. It is believed that layera 36 and 38 substantially prevent reaction between Al and Au or Ag in the top layer during annealing.

One typical stack or in-process contact includes about 190–210 Å of aluminum, about 390–410 Å of titanium, about 490–510 Å of platinum and about to 6000 Å to 5 $\mu$m of gold. These thicknesses can be varied. The Al thickness decides the thickmess of the other layers. As Al thickness increases, it is necessary to increase the thickness of the Ti and Pt layers to avoid diffusion of Al into Au and diffusion of Au into Al. With increased thickness of Au, the possibility of cratering of the semiconductor during wire bonding dramatically reduces.

The annealing of this stack can be performed either in nitrogen, argon or other inert gas, or air. Moderate temperatures of 400–600 C. are sufficient for low contact resistances of the order of $10^{-5}$ ohm-cm$^2$ or lower. A preferred annealing process is conducted at 500° C. for 3 minutes in air. Where the first barrier layer includes Ti, there can be some diffusion of Ti into the Al-containing base layer during annealing. Where the top layer is formed predominantly from Au and the second barrier layer is formed predominantly from Pt, the finished contact 28, at the end of the annealing process, has a top surface portion which consists essentially of the Au, but which may include some Pt. Most preferably, this surface portion is essentially devoid of Al, and preferably is essentially devoid of Ti as well.

After annealing, the resulting semiconductor unit may be connected to gold-bearing leads such as fine gold wires 42 and 44 by bonding the leads to the pad 22 of the p-contact and to the pad portion 30 of the n-contact. The bonding process may be performed using conventional wire-bonding equipment. The surface morphology of the annealed n-contact is excellent, and correspondingly, the adhesion of the wire bond to the contact is excellent. This is evidenced by the nonobservation of any failure of the wire bond at the bond/contact interface during wire bond stress tests. The failure always occurs at the ball/wire interface.

Although the invention has been described above with reference to n-type GaN, it can also be applied to form contacts on other n-type III–V semiconductors, most preferably nitride semiconductors and pure nitride semiconductors. As used in this disclosure, the term "III–V" semiconductor means a semiconductor according to the stoichiometric formula $Al_aIn_bGa_cN_xAs_yP_z$ where (a+b+c) is about 1 and (x+y+z) is also about 1. The term "nitride semiconductor" refers to a III–V semiconductor in which x is 0.5 or more, most typically about 0.8 or more. The term "pure nitride semiconductor" refers to a nitride semiconductors in which x is about 1.0. The term "gallium nitride based semiconductor" as used herein refers to a nitride semiconductor including gallium. The term "n-type" as used herein with reference to a semiconductor means a semiconductor having n-type conductivity, i.e., a semiconductor in which electrons are the majority carriers. Certain semiconductors, such as GaN, exhibit n-type conductivity even when undoped. n-type conductivity can be imparted or enhanced by addition of conventional dopants as, for example, Si. Typically, the n-type semiconductor and the contact formed according to the invention is incorporated in a device which also includes other semiconductors. For example, the device may be an optoelectronic device such as a laser or light emitting diode ("LED") which includes a p-type semiconductor and a p-n junction between the p-type semiconductor and the n-type semiconductor.

Figure 2:
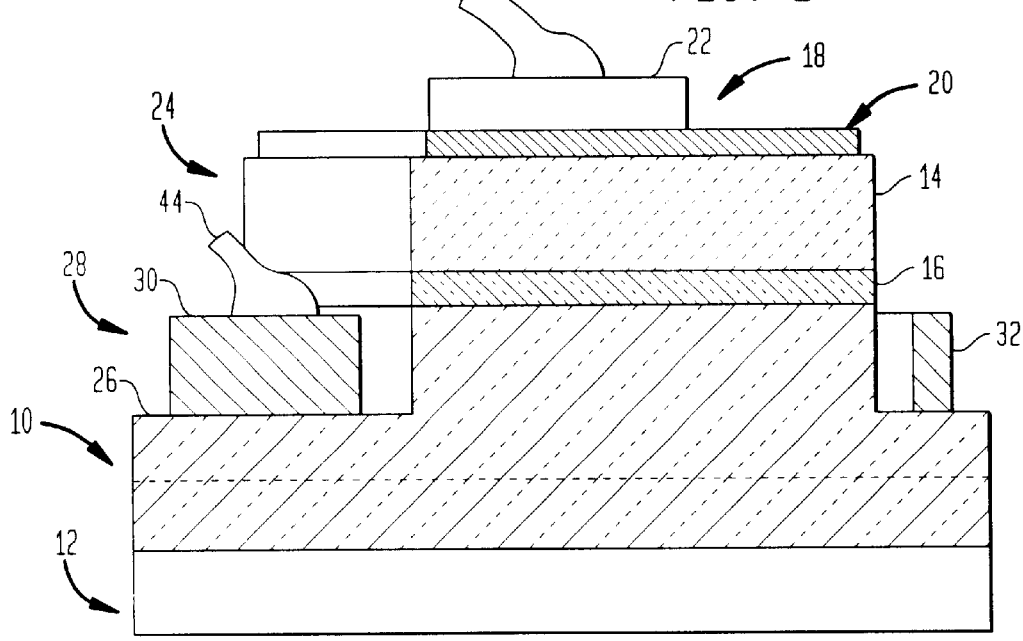
FIG. 2 is a sectional view taken along line 2—2 in FIG. 1.

It is not essential to provide all of the layers over the entire surface area of the in-process n-contact 28'. For example, in the configuration illustrated in FIGS. 1 and 2, only the pad region 30 of the finished n-contact 28 is bonded to a lead 44. Thus, the Au or other top layer 40 and the Pt or other second barrier layer 38 may be omitted in portions of the in-process contact which will form the strip region 32.

The particular contact configuration illustrated in FIG. 1 is only illustrative. The same contact forming process and contact metallurgy can be applied in to formation of an n-contact of any size or shape. Leads other than gold wires can be bonded to the contacts. For example, the leads can be provided as parts of lead frames or on dielectric supports of the types commonly used in tape automated bonding ("TAB") processes. Further, the semiconductor unit can be mounted by processes other than lead bonding as, for example, by solder-bonding to the pads. Most preferably, these leads are formed from gold or include gold at their surfaces. Also, the semiconductor unit need not be an LED as discussed above with reference to FIG. 1. Thus, the present invention can be applied to formation of an n-contact on any device which includes an n-type III–V region as discussed above.

As these and other variations and combinations of the features described above can be utilized without departing from the present invention, the foregoing description of the preferred embodiments should be taken by way of illustration rather than by way of limitation of the present invention.

What is claimed is:

1. A method of forming a contact on an n-type III–V semiconductor comprising the steps of:
   (a) depositing Al on the n-type III–V semiconductor to provide a base layer; then
   (b) depositing Ti on said base layer to provide a first barrier layer; then
   (c) depositing Pt on said first barrier layer to provide a second barrier layer; then
   (d) depositing Au on said second barrier layer to provide a top layer, whereby said base layer, said first barrier layer, said second barrier layer, and said top layer form a stack on the n-type semiconductor; and then
   (e) annealing said n-type III–V semiconductor with said stack thereon.

2. A method as claimed in claim 1 wherein said annealing step is performed at about 400–600° C.

3. A method as claimed in, claim 2 wherein said annealing step is performed for between about 1 minute and about 10 minutes.

4. A method as claimed in claim 2 wherein said annealing step is performed for about 3 minutes.

5. A method as claimed in claim 4 wherein said annealing step is performed at about 500° C.

6. A method as claimed in claim 1 wherein said first barrier layer is at least about 300 Å thick.

7. A method as claimed in claim 6 wherein said first barrier layer is about 390 Å to about 410 Å thick.

8. A method as claimed in claim 6 wherein said deposited Al is between about 190 Å to about 210 Å thick.

9. A method as claimed in claim 6 wherein said second barrier layer is about 490 Å to about 510 Å thick.

10. A method as claimed in claim 6 wherein said top layer is at least about 6000 Å thick.

11. A method as claimed in claim 1 wherein said n-type semiconductor is a nitride compound semiconductor.

12. A method as claimed in claim 1 wherein said n-type semiconductor is a pure nitride compound semiconductor.

13. A method as claimed in claim 11 wherein said n-type semiconductor is a gallium nitride based semiconductor.

14. A method as claimed in claim 11 wherein said n-type semiconductor is GaN.

15. A method as claimed in claim 1 wherein said Al/Ti/Pt/Au contact has a contact resistance of less than about $10^{-5}$ ohm-cm$^2$.

16. A method as claimed in claim 1 wherein said base layer is about 20 nm thick.

17. A method as claimed in claim 1 wherein said base layer is less than about 50 nm thick.

* * * * *

(12) INTER PARTES REVIEW CERTIFICATE (123rd)
United States Patent
Brown et al.

(10) Number: US 6,653,215 K1
(45) Certificate Issued: Apr. 21, 2016

(54) CONTACT TO N-GAN WITH AU TERMINATION

(75) Inventors: Michael G. Brown; Ivan Eliashevich; Keng Ouyang; Hari Venugopalan

(73) Assignees: EMCORE CORPORATION; EMCORE SOLAR POWER, INC.

Trial Number:

IPR2012-00005 filed Sep. 16, 2012

Petitioner: Nichia Corporation

Patent Owner: Emcore Corporation

Inter Partes Review Certificate for:

Patent No.: 6,653,215
Issued: Nov. 25, 2003
Appl. No.: 09/971,965
Filed: Oct. 5, 2001

The results of IPR2012-00005 are reflected in this inter partes review certificate under 35 U.S.C. 318(b).

INTER PARTES REVIEW CERTIFICATE
U.S. Patent 6,653,215 K1
Trial No. IPR2012-00005
Certificate Issued Apr. 21, 2016

AS A RESULT OF THE INTER PARTES REVIEW PROCEEDING, IT HAS BEEN DETERMINED THAT:

Claims 1-17 are cancelled.

\* \* \* \* \*